United States Patent
Iinuma

(10) Patent No.: US 6,329,853 B1
(45) Date of Patent: Dec. 11, 2001

(54) PLL CIRCUIT

(75) Inventor: Yoshikazu Iinuma, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/583,780

(22) Filed: May 31, 2000

(30) Foreign Application Priority Data

Jun. 1, 1999 (JP) ............................................. 11-153884

(51) Int. Cl.[7] ...................................................... H03L 7/06
(52) U.S. Cl. ............................................ 327/157; 327/156
(58) Field of Search .................................... 327/156, 157, 327/141, 160, 151

(56) References Cited

U.S. PATENT DOCUMENTS 5,448,598 * 9/1995 Yousefi ................................. 327/156
5,872,807 * 2/1999 Booth et al. ......................... 375/200
5,917,873 * 6/1999 Shiimoto et al. .................... 327/156

* cited by examiner

*Primary Examiner*—Dinh T. Le
(74) *Attorney, Agent, or Firm*—Mattingly, Stanger & Malur, P.C.

(57) ABSTRACT

In a PLL circuit, with respect to a specific oscillation frequency representing a target frequency of an oscillation circuit in a PLL loop, a lower limit value and an upper limit value are set in advance in a predetermined range including the specified oscillation frequency, and a boost-up circuit which applies to the PLL loop or causes the PLL loop to generate a signal which causes to shift a control voltage in the direction of oscillating at the specified frequency in response to when the frequency of an output signal assumes the lower limit value or less than that of the predetermined range and further causes to shift the control voltage in the direction of oscillating at the specified frequency in response to when the frequency of the output signal assumes the upper limit value or more than that of the predetermined range, whereby a ringing of the frequency of the output signal when the PLL circuit is started, is suppressed.

8 Claims, 3 Drawing Sheets

(BOOST-UP CIRCUIT OFF)

(NO BOOST-UP CIRCUIT)

(BOOST-UP CIRCUIT OFF)

PLL CIRCUIT

BACKGROUND OF THE INVENTION

1. Field of the Invention

The present invention relates to a PLL (Phase Locked Loop) circuit and, more specifically, relates to a PLL circuit which permits to restore quickly to a target frequency to be locked when a device concerned enters into an operable condition either after making a power source or after being released from a stand-by condition or a sleep condition thereof.

2. Background Art

In a variety of electronic devices such as visual devices, audio devices and telecommunication devices including recent recording and reproducing devices, a timing clock which serves as a timing reference is used for signal processings such as signal demodulation, signal transmission, signal detection, synchronous detection and synchronous separation. In order to generate the timing clock a PLL circuit is used. Further, such PLL circuit is frequency used for generating a main clock for a system concerned.

In the variety of devices as referred to above, when an operation thereof is not required or the device is not used, a controller therein such as for a CPU and an MPU is usually placed in a stand-by condition or a sleep condition so as to save power consumption. In accordance therewith the PLL circuit is also placed such as in a stand-by condition and a sleep condition.

Further, for a variety of portable electronic devices such as PHSs and portable telephones which require key operations, it is required to immediately enter into an operable condition after a power source is made, therefore, the time interval between the making and the subsequent key operation is short. Thus, PLL circuits for these kinds of electronic devices are required to quickly restore to a target frequency to be locked after the device concerned enters into an operable condition.

Accordingly, in order that a PLL circuit restores a target frequency to be locked in a short time either after a power source thereof being made or after being released from a stand-by condition or a sleep condition and in order that the PLL circuit generates clocks of stable frequency, conventionally, a boosting-up circuit is frequently provided. Such boosting-up circuit is usually designed to operate to rapidly increase a control voltage of a VCO (Voltage Controlled Oscillator Circuit) incorporated in the PLL circuit toward a control voltage (target voltage) of a locked frequency. The boosting-up circuit turns off and terminates its operation at the moment when the control voltage reaches the target voltage.

FIG. 4(a) and 4(b) are diagrams for explaining a characteristic until the control voltage of the VCO incorporated in a PLL circuit how the target frequency are restored, when the PLL circuit is activated. Wherein the abscissa represents an input voltage (control voltage) of the VCO and Vob is a target voltage, and the ordinate represents time t.

FIG. 4(a) represents a case where no boosting-up circuit is provided and it is observed that the PLL circuit is required a comparatively long time to restore to a stable locked frequency either after the power source for the device concerned is made or after being released from a stand-by condition or a sleep condition thereof. Further, the control voltage of the VCO corresponds to the oscillation frequency of the PLL circuit.

FIG. 4(b) represents a characteristic of a conventional PLL circuit which is provided with a boosting-up circuit, in this PLL circuit, because the control voltage is rapidly increased toward the target voltage Vob either after the device concerned is made or after being released from a stand-by condition or a sleep condition thereof, an overshooting and an under shooting are generated in the oscillation frequency of the PLL circuit, in that a so called indicial response characteristic appears. For this reason, a ringing in the oscillation frequency is generated, therefore, it takes a certain time until this characteristic settles. Further, t1 in the drawing indicates the timing when the boosting-up circuit is turned OFF.

SUMMARY OF THE INVENTION

An object of the present invention is to solve such conventional problems and to provide a PLL circuit which permits to restore quickly to a target frequency to be locked when a device concerned enters into an operable condition either after a power source thereof is made or after a stand-by condition or a sleep condition thereof has been released.

A PLL circuit according to the present invention which achieves the above object, is characterized in that the PLL circuit comprises, a voltage controlled oscillation circuit (VCO), a phase comparing circuit which receives a clock from outside of the PLL circuit and compares phases of an output signal of the voltage controlled oscillation circuit (VCO) and the clock received, an oscillation circuit by means of a PLL loop which generates a control voltage for the voltage controlled oscillation circuit depending on a phase comparison result of the phase comparing circuit and generates the output signal of a specified frequency which is locked to the frequency of the clock; and a boosting-up circuit which receives the clock and the output signal, applies to the PLL loop or causes the PLL loop to generate a signal which causes to shift the control voltage in the direction of oscillating at the specified frequency in response to when the frequency of the output signal assumes a lower limit value or less than that of a predetermined range including the specified frequency with respect thereto and further causes to shift the control voltage in the direction of oscillating at the specified frequency in response to when the frequency of the output signal assumes an upper limit value or more than that of the predetermined range and interrupts activation for the PLL loop when the specific frequency is in the predetermined range, whereby a ringing of the frequency of the output signal which is caused when the PLL circuit is started, is suppressed.

As has been explained above, in the present invention, with respect to the specific oscillation frequency representing the target frequency of the oscillation circuit in the PLL loop the lower limit value and the upper limit value are set in advance in the predetermined range including the specified oscillation frequency, and applies to the PLL loop or causes the PLL loop to generate the signal which causes to shift the control voltage in the direction of oscillating at the specified frequency in response to when the frequency of the output signal assumes a lower limit value or less than that of a predetermined range including the specified frequency with respect thereto and further causes to shift the control voltage in the direction of oscillating at the specified frequency in response to when the frequency of the output signal assumes an upper limit value or more than that of the predetermined range.

The predetermined range to be suppressed is set smaller than a variation range from first upper side to the first lower side of the ringing in the oscillation frequency which varies up and down until the same is locked to the oscillation frequency of the VCO. Further, when the oscillation frequency falls within the range defined by the upper and lower limits, the boost-up circuit is placed in a condition with no activation for the oscillation circuit in the PLL circuit. Thereby, the oscillation circuit in the PLL circuit can be shifted into a stable locked condition under a self loop operation with respect to the frequency of the clock supplied from an outside.

In the present invention a large value of control current which is generated by the boosting-up circuit can be used, therefore, even if a control current having a large value is flown in the PLL oscillation circuit, since the up and down oscillation frequency range of the PLL circuit with respect to the target frequency after the power source of the device concerned is made or after the stand-by condition or the sleep condition thereof is released is restricted by the upper limit frequency and the lower limit frequency, the same is restricted smaller than the ringing range of the original oscillation frequency with no restriction. Therefore, the time required until the oscillation frequency is locked to the frequency of the clocks supplied from the outside can be reduced shorter than that obtained by the boost-up circuit provided in a conventional PLL circuit.

As a result, the PLL circuit according to the present invention can quickly shift the control voltage toward the control voltage of the target frequency by means of the PLL loop either after the power source of the device concerned is made or after the stand-by condition or the sleep condition is released, thereby, the PLL oscillation circuit is caused to oscillate quickly under a stable locked condition.

Further, in the present invention, through the provision of a programmable divider in the PLL oscillation circuit which permits an external setting of an oscillation frequency to be locked, an optimum boost-up condition which meets the use object can easily be created. With such provision, a proper oscillation frequency for every product or every set to be used can be selected, thereby, a proper PLL circuit can be prepared. The following embodiments which will be explained hereinbelow are some of these examples.

BRIEF DESCRIPTION OF THE EMBODIMENTS

DETAILED DESCRIPTION OF THE PREFERRED EMBODIMENTS

Figure 1:
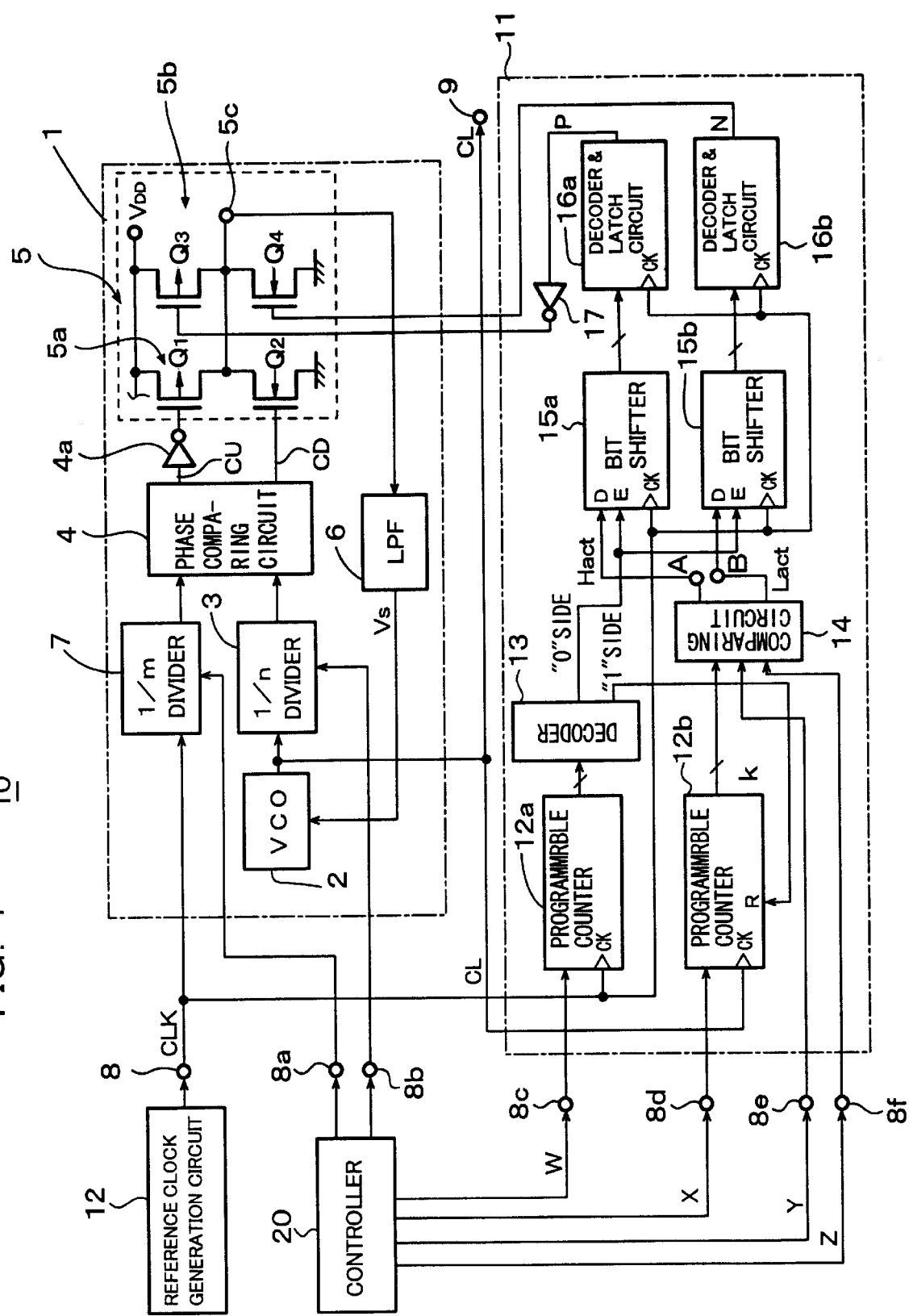
FIG. 1 is a circuit diagram of an embodiment to which a PLL circuit according to the present invention is applied.

A PLL circuit 10 in FIG. 1 is constituted by an oscillation circuit (hereinbelow called as PLL oscillation circuit) 1 in a form of a PLL loop and a boost-up circuit 11, receives reference clocks CLK (hereinbelow clocks CLK) from a reference clock generating circuit 12 and, after a power source thereof is a made, is set at a variety of set values output from a controller 20 (which will be explained later).

The PLL oscillation circuit 1 is an oscillation circuit which receives clocks CLK from the reference clock generation circuit 12 at an input terminal 8, compares phases of the received clocks and self oscillation signals and oscillates while being locked to the frequency thereof, and in the PLL oscillation circuit 11 a voltage controlled oscillation circuit (VCO) 2, a 1/n divider 3, a phase comparing circuit 4, a charge pump 5, a low pass filter (LPF) 6 and a 1/m divider 7 are provided. Outputs of the VCO 2 are output at an output terminal 9 as system clocks or timing clocks.

Herein, the VCO 2 is, for example, constituted by a ring oscillator in which inverters in odd number stages are connected in series and the output of the series connection is fed back to the input thereof, utilizes control voltages Vs obtained from the LPF 6 as power source voltage for the respective inverters for controlling the oscillation frequency of the VCO 2, and through the control of the voltages the oscillation frequency of the VCO is controlled.

The frequency of the control voltage Vs is controlled in the PLL circuit 1 so as to match with the frequency of the clocks CLK of the reference clock generation circuit 12 or a frequency determined by multiplying the frequency of the clocks by a predetermined coefficient. Namely, in the PLL circuit 1, the output (clocks CL) of the VCO 2 is input into one of two input terminals of the phase comparing circuit 4 after being divided into 1/n by the 1/n divider 3, to the other terminal thereof the clocks CLK are input via the 1/m divider 7 and the both are compared therein with regard to phases thereof.

The 1/n divider 3 and the 1/m divider 7 are respectively constituted by an n adic counter and a m adic counter and the maximum count values, namely adic numbers n and m are set or altered by data inputted to input terminals 8a and 8b from a controller 20. The controller 20 alters the frequency of the clocks CL generated by the PLL circuit 10 by altering the dividing rates of the 1/n divider 3 and the 1/m divider 7. Thereby, the oscillation frequency is made programmable herein.

The phase comparing circuit 4 sends out a chargeup signal CU, of which level comes HIGH (hereinbelow "H") for a period corresponding to a phase difference from a rising up of the clocks CLK to a rising up of the input signals at the side of the VCO 2, via an inverter 4a to the charge-up pump 5 and turns ON a P channel MOS transistor Q1 at the current discharge side of a charge pump circuit 5a (as a push-pull circuit). At this instance, an N channel MOS transistor Q2 at the current sink side thereof is turned OFF, because a charge-down signal CD assumes LOW level (hereinbelow, as "L"). Further, the phase comparing circuit 4 sends out a charge-down signal CD, of which level comes "H" for a period corresponding to a phase difference from a rising up of the input signals at the side of the VCO 2 to a rising up of the clocks CLK, to the charge pump circuit 5a and turns ON the MOS transistor Q2 at the current sink side. At this instance, the MOS transistor Q1 thereof is turned OFF, because a charge-up signal CU assumes "L".

These output signals of the charge pump 5 are applied to the LPF 6 via its output terminal 5c and are smoothed to form the control voltages Vs for the VCO 2. Namely, from the LPF 6 the control voltages Vs are generated which lock the oscillation frequency of the VCO 2 so as to match with the frequency of the clocks CLK or with the frequency determined by multiplying the above frequency by a predetermined rate. Herein, in the charge pump 5 another charge pump circuit (as a push-pull circuit) 5b constituted by a P channel MOS transistor Q3 and an N channel MOS transistor Q4, which is connected at the output terminal 5c in parallel with the charge pump circuit 5a, is provided. The charge pump circuit 5b is controlled by the boost-up circuit 11 at the time of device start or when being released from a stand-by condition or a sleep condition thereof.

Further, when a power source of the device concerned is made or when the device is released from such as the stand-by condition or the sleep condition, supply of operation powers to the respective circuit is initiated and the PLL circuit is simply started, therefore, such condition is not illustrated specifically here.

Now, the rated currents of the MOS transistors Q3 and Q4 in the charge pump circuit 5b are determined larger than those of the MOS transistors Q1 and Q2 and the current driving capacity of the charge pump circuit 5b is set larger than that of the charge pump circuit 5a.

As illustrated in FIG. 1, the boost-up circuit 11 is constituted by programmable counters 12a and 12b, a decoder 13, a comparing circuit 14, bit shifters 15a and 15b and decoder & latch circuits 16a and 16b.

The programmable counter 12a is a W adic counter which receives the clocks CLK and receives the set value W from the controller 20 via an input terminal 8c at the time when a power source is made, counts the clocks CLK by the set value W and repeats the same. With the counter 12a and the decoder 13 a divider circuit which divides the clocks CLK into 1/W is formed. The decoder 13 receives respective digits of the count value of the programmable counter 12a in j bits parallel, and performs decoding respectively when the count value assumes "0" and "1", in that when the count value assumes "0", the decoder 13 outputs its decode output to enable terminals E of the bit shifter 15a and the bit shifter 15b, and further, when the count value assumes "1", the decoder 13 outputs its decode output to a reset terminal R of the programmable counter 12b to reset the count value in the programmable counter 12b.

The programmable counter 12b is an X adic counter which receives the clocks CL of the VCO 2 and further receives the set value X from the controller 20 via an input terminal 8d at the time when the power source is made, counts the clocks CL within a range of X and repeats the same. The count value is reset in a period of W times of the clocks CLK. Herein, the programmable counter 12b serves as a circuit which counts how many clocks CL of the PLL oscillation circuit 1 are generated in the period of W times of the clocks CLK. Therefore, the count value shows how many clocks CL are counted in the period of W times of the clocks CLK, corresponds to the oscillation frequency of the VCO 2 and assumes the value representing the same. The value representing the oscillation frequency of the VCO 2 is output to the comparing circuit 14, and the comparing circuit 14 compares an upper limit value and a lower limit value of the oscillation frequency of the VCO 2 which are set in advance with the value representing the oscillation frequency of the VCO 2.

The comparing circuit 14 is a comparing circuit of digital values which receives the upper limit set value Y and the lower limit set value Z from the controller 20 via input terminal 8e and 8f at the time when the power source is made and further receives the value of the programmable counter 12b in k bits parallel, and detects whether the received value exceeds the upper limit set value Y or drops below the lower limit set value Z. These comparison with the upper limit set value Y and the lower limit set value Z corresponds to comparison of the oscillation frequency of the VCO 2 with specific values and the upper limit set value Y and the lower limit set value Z respectively correspond to back and forth frequencies in a predetermined range from the target frequency. Therefore, when the value of the programmable counter 12b exceeds the upper limit set value Y, it is implied that the current control voltage Vs is higher than the target voltage value Vob by a predetermined value, and when the value of the programmable counter 12b is less than the lower limit set value Z, it is implied that the current control voltage Vs is lower than the target voltage Vob by a predetermined value.

Figure 4A:
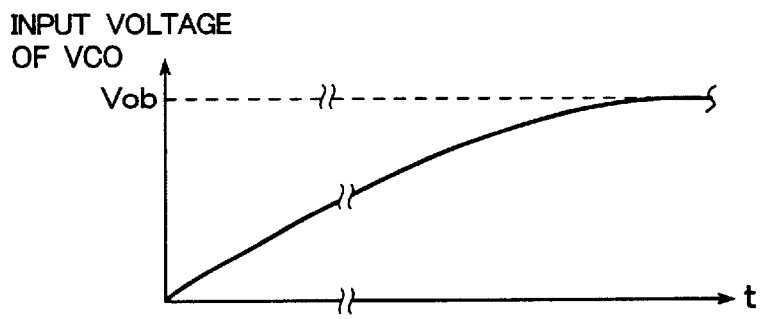
FIGS. 4(a) and 4(b) are diagrams for explaining characteristics of the control voltages of VCOs until the same are locked to target frequencies in conventional PLL circuits.
Figure 4B:
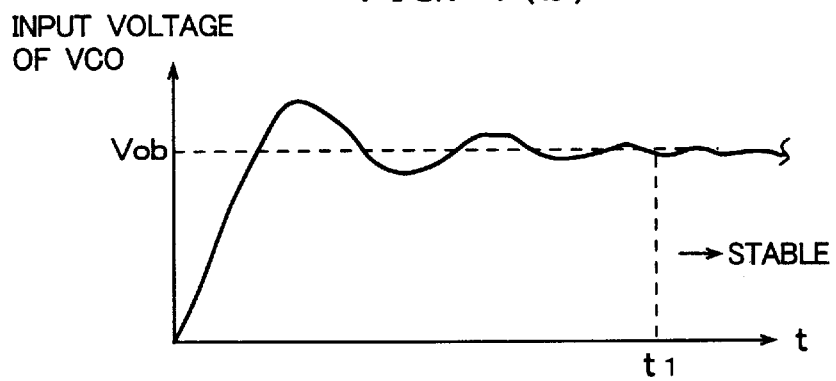

Further, the range determined here by the upper limit set value Y and the lower limit set value Z is selected to give a small value than a variation range which is defined by the first upper side and lower side ringing (see FIG. 4(b)) of the oscillation frequency which varies up and down direction with respect to the target frequency at least until the frequency of clocks CL of the VCO 2 is locked.

Accordingly, when the value of the programmable counter 12b exceeds the upper limit set value Y, the comparing circuit 14 generates at an output terminal B a bit signal (Lact)="1" for N channel side drive of the charge pump 5b and generates at an output terminal A a bit signal (Hact)="1" for P channel side drive thereof. Contrary, when the value of the programmable counter 12b is less than the lower limit set value Z, the comparing circuit 14 generates at the output terminal A a bit signal (Hact)="1" for P channel side drive and generates at the output terminal B a bit signal (Lact)="0" for N channel side drive of the charge pump 5b.

When the value of the programmable counter 12b falls in the range between the upper limit set value Y and the lower limit set value Z, the comparing circuit 14 outputs "0" at both output terminals A and B.

Further, herein the bit "1" implies drive and the bit "0" implies drive interruption.

Now, since the comparing circuit 14 compares the count value of the programmable counter 12b with the upper limit set value Y and the lower limit set value Z, when the count value is small, the bit signal "1" for P channel side drive is always generated so that the comparison only becomes effective at a timing when the bit shifters 15a and 15b receive an output of the decoder 13 which decodes the count value "0" of the programmable counter 12a and otherwise the comparison result of the comparing circuit 14 is ineffective which will be explained later.

Now, the bit shifters 15a and 15b are circuits provided respectively for countermeasuring noises and, for example, are constituted by shift registers of a stages representing a predetermined digit number. Thus, when the bit signal "1" for P channel side and N channel side drives of the charge pump 5b continues by a predetermined number (digit number a), an actual drive bit is generated.

The bit shifter 15a receives at a data terminal D the signal Hact from the output terminal A of the comparing circuit 14, receives at an enable terminal E the output of the decoder 13 of the count value "0", and further receives at a clock input terminal ck the locks CLK, and values "1" and "0" representing the comparison result signal Hact are set in synchronism with the clocks CLK.

Further, the bit shifter 15b receives at a data terminal D the signal Lact from the output terminal B of the comparing circuit 14, receives at an enable terminal E the output of the decoder 13 of the count value "0", and further receives at a clock input terminal ck the clocks CLK, and values "1" and "0" representing the comparison result signal Lact are set in synchronism with the clocks CLK. Thereby, the comparison result of the comparing circuit 14 becomes effective, when a signal is inputted at the enable terminals E of the bit shifters 15a and 15b, and the values of the comparison result at this moment are input into the bit shifters 15a and 15b in synchronism with the clocks CLK.

Further, since the data (one bit) setting at the bit shifters 15a and 15b is performed in every division rate W of the frequency of the clocks CLK, the stage number thereof is determined in relation to the frequency of the clocks CLK and is selected in such a manner that the stage number never affects the quick operation at the time of the power source making or at the time of restoring after being released of the stand-by condition or the sleep condition thereof.

As a result, when a pieces of "1" (a represents the stage number of the bit shifters 15a and 15b) continues in the number of clocks CLK a×W times, a decoder & latch circuit 16b generates an actual bit signal N for N channel side drive and a decoder latch circuit 16a generates a bit signal P for P channel side drive. Further, when a pieces of "0" continues in the number of clocks CLK a×W times, a decoder latch circuit 16b interrupts an actual bit signal N for N channel side drive and a decoder latch circuit 16a interrupts a bit signal P for P channel side drive.

Namely, when all digit numbers of either shift registers in the bit shifters 15a and 15b are rendered as "1", the respective decoder & latch circuits 16a and 16b receive respective digit bits in parallel from either the bit shifter 15a or the bit shifter 15b of which all bits are rendered to "1", and after detecting respectively the condition of all bits "1" and being latched of such signal, the actual bit signal N for N channel side drive or the actual bit signal P for P channel side drive is rendered to "H" which is continuously generated until the subsequent latch time.

On the other hand, when all digit numbers of either shift registers in the bit shifters 15a and 15b are rendered as "0", the respective decoder latch circuits 16a and 16b detect respectively the condition of all bits "1" and cause to latch of such signal, the actual bit signal N for N channel side drive or the actual bit signal P for P channel side drive is rendered to "L" to interrupt the drive thereof respectively.

Further, at this instance, the signals "1" and "0" are output to the charge pump 5b as signals "H" and "L".

Accordingly, when the output of the decoder latch circuit 16a is "H", "L" is applied to the gate of the P channel MOS transistor Q3 via an inverter 17 to turn ON the transistor, and when the output of the decoder latch circuit 16a is "L", "H" is applied to the P channel MOS transistor Q3 to turn OFF the transistor. On the other hand, when the output of the decoder latch circuit 16b is "H", "H" is applied to the gate of the N channel MOS transistor Q4 to turn ON the transistor, and when the output of the decoder latch circuit 16b is "L", "L" is applied to the N channel MOS transistor Q4 to turn OFF the transistor.

Further, the latching timing of the decoder latch circuits 16a and 16b is effected in synchronism with the clocks CLK while receiving the clocks CLK at the clock terminals (latch terminal) ck.

Now, an overall operation of the circuit will be explained, in that the PLL circuit 10 is normally activated by supplying a power from a source and is started. When a power from the power source is supplied and the PLL circuit 10 enters into an operating condition, the set values W and X and the upper and lower limit set values Y and Z are inputted from the controller 20 at the time when the power source is made.

Further, the PLL circuit 10 performs the same operation at the time when the power source is made as at the time when the device enters into an operating condition after being released from the stand-by condition or the sleep condition thereof, therefore, the explanation hereinbelow will be proceeded as the operating condition after being released from the stand-by condition or the sleep condition is included in the operating condition after the power source is made. However, when the device is restored from the stand-by condition or the sleep condition, it is unnecessary to output again the set values W and X and the upper and lower limit set values Y and Z from the controller 20.

Figure 2:
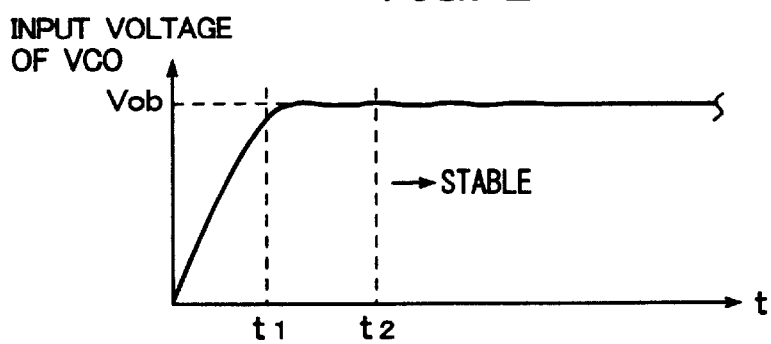
FIG. 2 is a diagram for explaining a characteristic of control voltage of a VCO until the control voltage thereof is locked to its target frequency.

At an early stage after being started, since the frequency of the VCO 2 is extremely lower than the target frequency, and is less than the lower limit set value Z. Therefore, the comparing circuit 14 continues to generate in every division rate W of the frequency of the clocks, as an effective output representing the comparison result, the bit signal "1" (Hact= "1") for P channel side drive of the charge pump 5b at the output terminal A and the bit signal "0" (Lact="0") for N channel side drive at the output terminal B. Thereby, the output of the decoder & latch circuit 16a is rendered to "H" and the P channel MOS transistor Q3 is turned ON via the inverter 17. On the other hand, the output of the decoder & latch circuit 16b is rendered to "L" and the N channel MOS transistor Q4 is turned OFF. As a result, the control voltage Vs rises rapidly toward the control voltage Vob of the target frequency, which is the early stage characteristic of the control voltage Vs as illustrated in FIG. 2.

Of course, since the P channel MOS transistor Q1 in the charge pump 5a is also turned ON in this moment in response to the phase comparison result of the phase comparison circuit 4, the both charging currents are sent to the LPF 6. However, as has been explained previously, since the current drive capacity of the transistor Q3 is determined larger than that of the transistor Q1, the increase of the control voltage is primarily controlled by the ON operation of the MOS transistor Q3.

Further, after the time when the upper limit set value Y is exceeded, the comparing circuit 14 continues to generate in every division rate W of the frequency of the clocks CLK as an effective output the bit signal "1" (Lact="1") for N channel drive side of the charge pump 5b at the output terminal B and the bit signal "0" (Hact="D") for P channel side drive thereof at the output terminal A. Therefore, in this instance, the output of the decoder & latch circuit 16b is rendered to "H" and the N channel MOS transistor Q4 is turned ON. On the other hand, the output of the decoder & latch circuit 16a is rendered "L" and the P channel MOS transistor Q3 is turned OFF via the inverter 17. Thereby, the control voltage Vs rapidly drops. At this moment, likely, since the N channel MOS transistor Q2 in the charge pump 5a is also turned ON in response to the phase comparison result of the phase comparison circuit 4, the both discharging currents are send out to the LPF 6, however, since the current drive capacity of the transistor Q4 is larger than that of the transistor Q2, the operation of the transistor Q4 is dominant with respect to the sink currents to be absorbed.

Subsequently, regardless to the phase comparison result of the phase comparison circuit 4 which compares both clocks or in addition to the comparison result, through a forced operation of the comparing circuit 14 other than the above the transistors Q3 and Q4 are turned ON/OFF and depending on the current values thereof the control voltage Vs is forcedly moved between the upper and lower set values Y and Z or is moved at once, thereby, the control voltage Vs is rapidly set in a range between the upper and lower set values Y and Z.

When the control voltage Vs falls in the range between the upper and lower limit set values Y and Z, the both outputs at the output terminals A and B of the comparing circuit 14 assume "0" and the both outputs of the decoder & latch circuits 16a and 16b are rendered to "L", thereby, the transistors Q3 and Q4 are also turned OFF. Thus, the operation of the charge pump 5b is stopped. As a result, the boost-up circuit 11 assumes an interrupt condition (OFF condition) with regard to the PLL oscillation circuit 1 and the relationship with the PLL oscillation circuit 1 is interrupted, and the PLL oscillation circuit 1 moves to a stable locked condition under an inherent independent operation operating in response to the phase comparison circuit 4.

Herein, the boost-up circuit 11 functions so as to limit or prevent generation of a large over shooting or under shooting of the oscillation frequency (which corresponds to the control voltage Vs) of the PLL oscillation circuit 1, when the oscillation frequency thereof exceeds the range between the upper and lower limit set values Y and Z. Further, when the oscillation frequency of the PLL oscillation circuit 1 falls in the range between the upper and lower limit set values Y and Z. the operation of the boost-up circuit 11 is interrupted, the control voltage Vs is controlled in response to the phase comparison result of the phase comparison circuit 4 which compares both clocks.

As a result, since the over shooting and the under shooting as illustrated in FIG. 4(b) are prevented from the early stage, the control voltage Vs is rapidly stabilized at the target voltage Vob according to the characteristic as illustrated in FIG. 2, after the power source of the device is made or after the stand-by condition or the sleep condition thereof is released. The oscillation frequency of the PLL oscillation circuit 1 which is controlled by the control voltage Vs is likely stabilized.

Still further, the timing t1 in the drawing, when the boost-up circuit 11 is turned OFF, is a moment when the control voltage Vs (in other words, the oscillation frequency) falls in the range between the upper and lower limit set values Y and Z, the timing t2 represents a stabilized condition in which the oscillation frequency is locked to the frequency of the clocks CLK, and the period between the timings t1 and t2 is a period until the oscillation frequency is locked and stabilized through the operation of the PLL oscillation circuit 1 itself.

Figure 3:
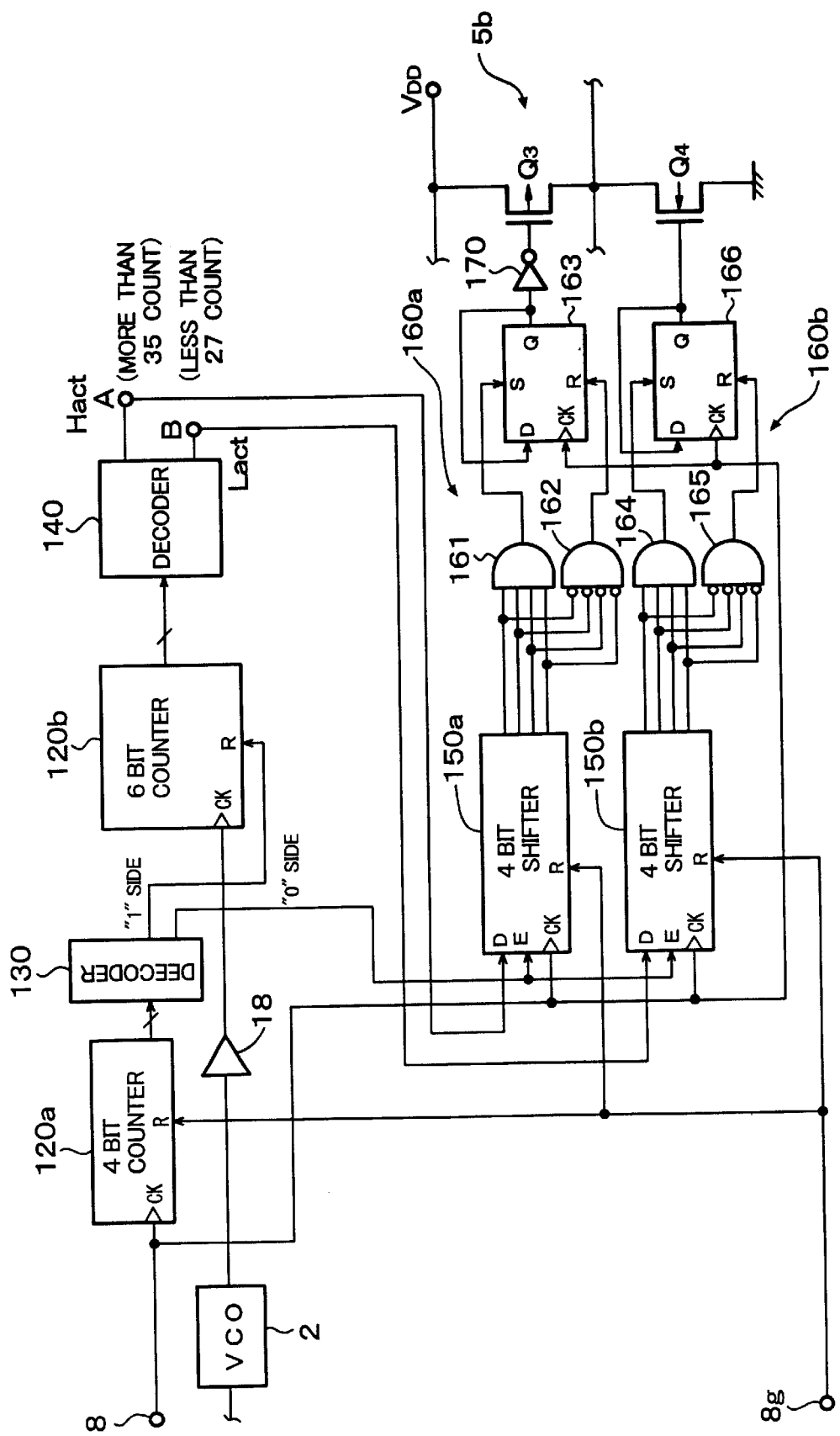
FIG. 3 is a diagram for explaining a concrete circuit of another boost-up circuit in an embodiment according to the present invention.

FIG. 3 is a diagram for explaining a concrete circuit of another boost-up circuit representing an embodiment according to the present invention. In place of the comparing circuit 14 in FIG. 1, a decoder 140 is provided. Further, the decoder & latch circuits 16a and 16b are constituted by simple circuits 160a and 160b each with a gate circuit and a flip-flop circuit. Still further, optimum set values are in advance selected and set in the respective counters instead of setting the respective set values W, X, Y and Z from the controller 20. In addition, in FIG. 3 embodiment the corresponding elements of the boost-up circuit 11 in FIG. 1 are designated by respective corresponding reference numerals each digit of which is increased by one, therefore, the detailed explanation thereof is omitted.

A 4 bit counter 120a corresponds to the programmable counter 12a and of which count value is set at 16 adic. Namely, the set value W herein is 16. A decoder 130 is a circuit corresponding to the decoder 13. A 6 bit counter 120b corresponds to the programmable counter 12b and is a counter which receives at a clock terminal ck the clocks CL from the VCO 2 via buffer 18 and counts the clocks CL, and of which count value is set at 64 adic. Accordingly, when assuming the frequency of the clocks CLK is 40 MHz and the frequency of the VCO 2 is 80 MHz, the 6 bit counter 120b will receive in a normal condition 32 clocks of the clocks CL from the VCO 2 in FIG. 1 PLL oscillation circuit 1 in one period from the start to the reset thereof, and depending on variations of the frequency of the VCO 2, the 6 bit counter 120b will receive clocks of the value around 32 clocks. As values around 32 clocks, 35 clocks is determined as the value exceeding the upper limit set value and is decoded, and 27 clocks is determined as the value dropping below the lower limit set value and is decoded.

As decoder 140 corresponds to the comparing circuit 14 and generates a detection value in response to the comparison judgement with regard to the upper and lower limit values as a decoded signal. Therefore, the decoder 140 receives respective digit bits of the 6 bit counter 120b in parallel and depending on whether the received value is below a predetermined value R (in the present embodiment, R=27) or above a predetermined value Q (in the present embodiment, Q=35), the decoder 140 generates "1" at its output terminal A and generates at its output terminal B "0", when the received value is less than the predetermined value R. Further, when the received value is more than the predetermined value Q, the decoder 140 generates at the output terminal B "1" and at the output terminal A "0".

Further, as has been explained previously, when the received value is between 27 and 35, the outputs at the output terminals A and B assume "0". Still further, the values R and Q are selected as smaller values than those in the variation range from the first up side to down side ringing in the ringing frequency (or of its control voltage value) of the VCO 2, when the device is started.

The respective outputs of the decoder 140 are output to data terminals D of 4 bit shifters 150a and 150b. The 4 bit shifters 150a and 150b are respectively shift resisters of 4 bits and to their set terminals E "0" count value detection signal is input from the decoder 130 and to their clock terminals ck the clocks CLK are input.

Further, to the 4 bit counter 120a and to the 4 bit shifters 150a and 150b a reset signal R is input from the controller 20 via the input terminal 8g at the time when the power source for the PLL circuit 10 is made or at the time when the activation thereof is started. To the 6 bit counter 120b a decoded signal which is generated from the decoder 130 in response to "1" count value detection is input at its terminal R as a reset signal.

A decoder latch circuit 160a is constituted by a four input AND gate 161, a negative logic 4 input AND gate 162 and a D flip-flop (hereinbelow, simply called as flip-flop) 163. A decoder latch circuit 160b is constituted by a four input AND gate 164, a negative logic 4 input AND gate 165 and a flip-flop 166.

A Q output of the flip-flop 163 is connected to its D terminal thereof, and the Q output is input to the gate of the transistor Q3 in the charge pump circuit 5b via an inverter 170. A Q output of the flip-flop 166 is connected to the D terminal thereof, and the Q output is input to the gate of the transistor Q4 in the charge pump circuit 5b.

The four input AND gate 161 and the negative logic four input AND gate 162 respectively receive respective digit outputs of the 4 bit shifter 150a. The AND gate 161 generates a detection signal, when all digits of the 4 bit shifter 150a become "1", and with this detection signal data "1" is set in the flip-flop 163 in synchronism with the clocks CLK, and the AND gate 162 generates a detection signal, when all digits of the 4 bit shifter 150a become "0" and with the detection signal the flip-flop 163 is reset.

The four input AND gate 164 and the negative logic four input AND gate 165 respectively receive respective digit outputs of the 4 bit shifter 150b. The AND gate 164 generates a detection signal, when all digits of the 4 bit shifter 150b become "1", and with this detection signal data "1" is set in the flip-flop 166 in synchronism with the clocks CLK, and the AND gate 165 generates a detection signal, when all digits of the 4 bit shifter 150b become "0" and with the detection signal the flip-flop 166 is reset.

As a result, the inverted signal of the Q output of the flip-flop 163 is applied to the gate of the transistor Q3, and depending on "H" and "L" of the signal the transistor because to be turned ON/OFF. The Q output of the flip-flop 166 is applied to the gate of the transistor Q4, and depending on its "H" and "L" the transistor Q4 is caused to be turned ON/OFF. Further, in this instance, if a Q bar output of the flip-flop 163 is used, the inverter 170 can be eliminated.

An explanation of an over all operation of FIG. 3 embodiment is omitted, because such is substantially the same as that of FIG. 1 embodiment.

Now, under an early initial condition, the flip-flops 163 and 166 are started in a condition of reset and assume "0", and when all of the respective digits of the 4 bit shifters 150a and 150b become "1", the flip-flops 163 and 166 are respectively set at "1".

As has been explained hitherto, in the present embodiment, through the provision of the charge pump circuits 5a and 5b for the charge pump 5, it is designed that the control current is generated in the PLL loop, and when the control voltage Vs falls in the range between the upper and lower limit set values Y and Z, the boost-up circuit is automatically separated, however, the present invention is not limited to such specific circuit, but a circuit which receives clocks and oscillation signals from a VCO and applies from an outside to the PLL loop a signal which causes to shift a control voltage toward a predetermined oscillation frequency when the frequency of the oscillation signal is less than a lower limit value in a predetermined range which is set with respect to a target frequency (a predetermined oscillation frequency) and which also causes to shift the control voltage toward the predetermined oscillation frequency when the frequency of the oscillation signal exceeds an upper limit value of the predetermined range, can be used, and whether the frequency of the oscillation signal falls in the predetermined range is separately detected so as to turn OFF the boost-up circuit.

What is claimed is:

1. A PLL circuit comprising an oscillation circuit having a PLL loop including a charge pump circuit coupled between a voltage controlled oscillation circuit, and a phase comparing circuit which receives an external clock signal and compares phases of an output signal of the voltage controlled oscillation circuit and the received clock signal, the PLL loop generates a control voltage for the voltage controlled oscillation circuit depending upon a phase comparison result of the phase comparing circuit and generates an output signal of a specified frequency which is locked to a frequency of the clock signal; and a boost-up circuit which receives the clock signal and the output signal to generate a control signal to said charge pump circuit that causes the control voltage to shift in a direction that the voltage controlled oscillation circuit oscillates at the specified frequency in response to when the frequency of the output signal assumes a lower limit value or less than that of a predetermined range including the specified frequency with respect thereto and further cause the control voltage to shift in the direction that the voltage controlled oscillation circuit oscillates at the specified frequency in response to when the frequency of the output signal assumes an upper limit value or more than that of the predetermined range and interrupts shifting of the control voltage when the frequency of the output signal is in the predetermined range, whereby a ringing of the frequency of the output signal when the PLL circuit is started, is suppressed.

2. A PLL circuit according to claim 1, wherein the predetermined range is set at least smaller than a variation range from a first up side to a first down side of the ringing of the frequency of output signal varying up and down until the frequency of the output signal is locked to the frequency of the clock after a power source concerned is made or after being released from a stand-by condition or a sleep condition thereof.

3. A PLL circuit according to claim 2, wherein said charge pump circuit includes a first transistor circuit which performs a push pull operation in response to the phase comparison result of the phase comparison circuit, a second transistor circuit which performs a push pull operation upon receipt of the control signal and a low pass filter which generates the control voltage upon receipt of the outputs of the first and second transistor circuits, the boost-up circuit includes a detection circuit which detects upon receipt of the output signal whether the frequency of the output signal is equal to the lower limit value or less than that or equal to the upper limit value or more than that, and generates the control signal in response to the detection result of the detection circuit.

4. A PLL circuit according to claim 3, wherein the boost-up circuit further includes a divider circuit which receives the clocks and divides the same and a counter, the detection circuit is a comparing circuit of digital values, the output signal is a pulse signal, the counter counts the pulse number of the pulse signal in a period of the clocks divided by the divider circuit, the detection circuit receives the count value from the counter and compares the same with the value corresponding to the upper limit value and the value corresponding to the lower limit value, and generates the comparison result as the detection result.

5. A PLL circuit according to claim 4, wherein the divider circuit and the counter are respectively, programmable counters and their initial values are set from a circuit other than the PLL circuit at the time when the power source concerned is made.

6. A PLL circuit according to claim 3, wherein the boost-up circuit further includes a divider circuit which receives the clocks and divides the same and a counter, the detection circuit is a decoder, the output signal is a pulse signal, the counter counts the pulse number of the pulse signal in a period of the clocks divided by the divider circuit, the decoder receives the count value from the counter and decodes whether the count value is equal to or less than lower limit value or equal to or more than the upper limit value, and generates the decoded result as the detection result.

7. A PLL circuit according to claim 3, wherein the detection circuit generates a first signal of one bit when the frequency of the output signal assumes equal to or more than the upper limit value and generates a second signal of one bit when the frequency of the output signal assumes equal to or less than lower limit value, and the detection result is obtained when the first or second signal is continuously generated by a predetermined number.

8. A PLL circuit according to claim 7, wherein the boost-up circuit further includes a first bit shifter which receives the first signal and stores the same amounting a plurality of digits thereof and a second bit shifter which receives the second signal and stores the same amounting a plurality of digits thereof, and the detection result is obtained when the first signal is stored in the respective digits of the first bit shifter or the second signal is stored in the respective digits of the second bit shifter.

* * * * *